United States Patent [19]

Morin et al.

[11] Patent Number: 4,844,587
[45] Date of Patent: Jul. 4, 1989

[54] ACTIVE MATRIX DISPLAY SCREEN USING HYDROGENATED AMORPHOUS SILICON CARBIDE AND PROCESS FOR PRODUCING THIS SCREEN

[76] Inventors: Francois Morin, Le Carpont Lanmerin; Michel Le Contellec, 3 Hameau duChêne; Joseph Richard, 33 Lotissement Keranroux Ploubezre, all of 22300 Lannion, France

[21] Appl. No.: 71,773

[22] Filed: Jul. 10, 1987

[30] Foreign Application Priority Data

Jul. 16, 1986 [FR] France .................. 86 10349

[51] Int. Cl.$^4$ ............................................. G02F 1/13
[52] U.S. Cl. ............................................. 350/339 R
[58] Field of Search .................................. 350/339 R

[56] References Cited

U.S. PATENT DOCUMENTS

| 4,161,743 | 7/1979 | Yonezawa et al. | 357/16 |
|---|---|---|---|
| 4,224,636 | 9/1980 | Yonezawa et al. | 357/60 |
| 4,582,721 | 4/1986 | Yoshino et al. | 357/2 |
| 4,654,117 | 3/1987 | Aoki et al. | 350/339 R |

Primary Examiner—Stanley D. Miller
Assistant Examiner—Anita E. Pellman
Attorney, Agent, or Firm—Oblon, Spivak, McClelland, Maier & Neustadt

[57] ABSTRACT

The semiconductor making it possible to obtain thin film transistors is of hydrogenated amorphous silicon carbide. As this material is transparent, the stack constituted by the semiconductor and the insulant can be maintained over the entire wall, so that there is no need to expose the columns and blocks.

Application to flat-faced screen displays.

8 Claims, 4 Drawing Sheets

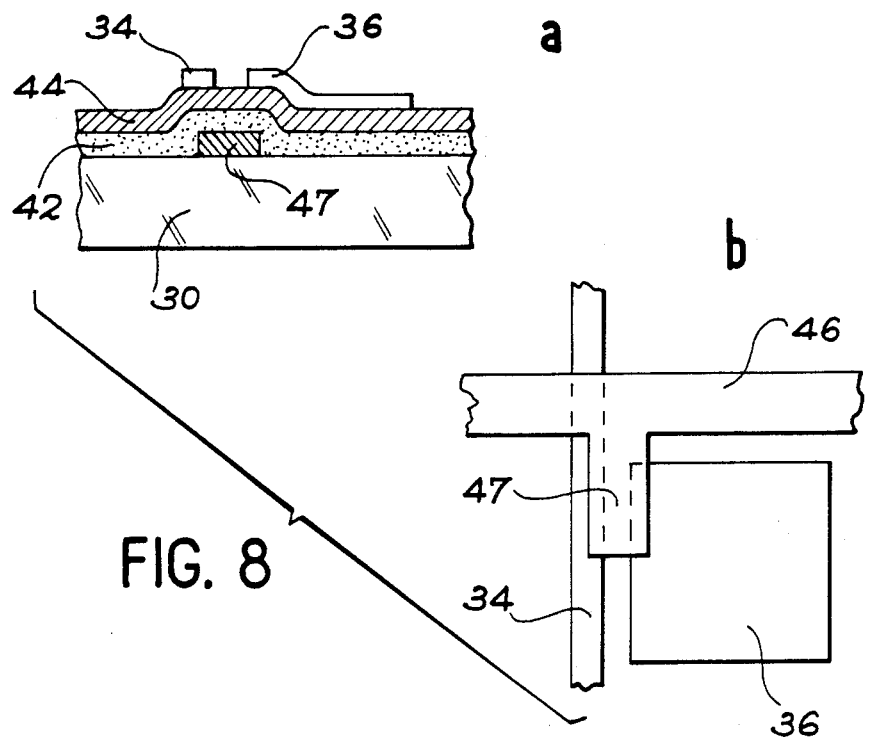
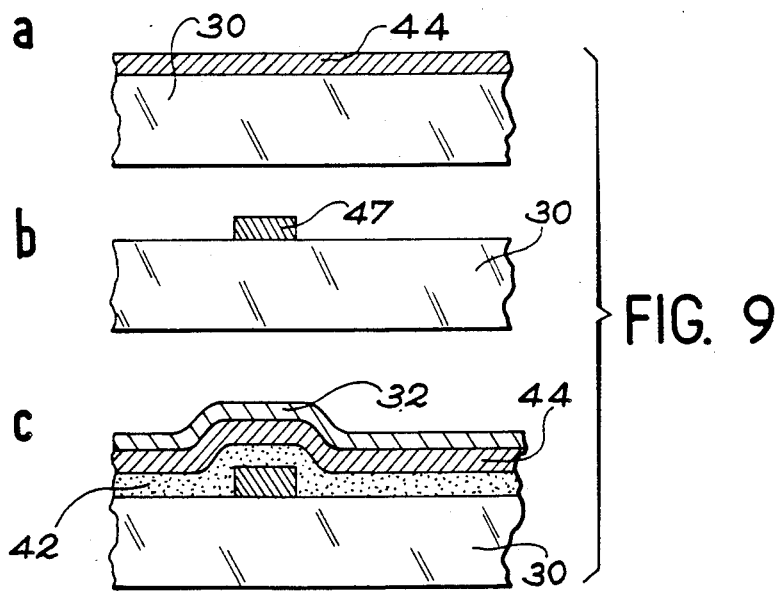
FIG. 8
FIG. 9

ACTIVE MATRIX DISPLAY SCREEN USING HYDROGENATED AMORPHOUS SILICON CARBIDE AND PROCESS FOR PRODUCING THIS SCREEN

BACKGROUND OF THE INVENTION

1. Field of the Invention

The present invention relates to an active matrix display screen and to a process for producing said screen. It is used in the display of information using liquid crystal screens.

2. Discussion of the Background

An active matrix display screen generally comprises two plates between which is inserted an electrooptical material, such as a liquid crystal. On one of these plates there is a matrix of transparent conductive blocks, thin film transistors, a group of conductive addressing rows and a group of conductive addressing columns. Each transistor has a gate connected to a row, a source connected to a block and a drain connected to a column. There is a counterelectrode on the other plate.

Such a structure is shown in FIG. 1 and it is possible to see in simplified form a lower plate 10 carrying conductive columns 12, conductive rows 14, transistors 20 and conductive blocks 22, as well as an upper plate 24 covered with a counterelectrode 26.

In order to obtain such a structure, it is possible to use a known process, whose main stages are illustrated in FIG. 2. This process comprises the following operations:
- preparation of a glass substrate 30 by physicochemical cleaning,
- deposition of a layer 32 of transparent conductive material, e.g. of tin and indium oxide (ITO) (part a),
- first photogravure, to give layer 32 the form of columns 34 and blocks 36 connected to a segment 38 (part b),
- deposition of a semi-conductor layer 40, an insulating layer 42 and a metal layer 44 (part c),
- second photogravure applied to the preceding stack for defining rows 46 overlapping segments 38 and intersecting columns 34, which defines thin film transistors (part d),
- general passivation by the deposition of a not shown SiO$_2$ layer.

Such a process, with two masking levels, is described in French patent application 2 533 072.

Although this "two level" process constitutes a significant improvement compared with other processes having 4-6 photolithography levels, it suffers from the disadvantage of producing a weak point in the structure obtained. This relates to the etching of the stack constituted by semiconductor 40, insulant 42 and metal 44. Overetching of the semiconductor is almost inevitable and can give rise to the formation of caverns, which favor the retention of impurities, which causes deterioration. This overetching is indicated by the reference numeral 41 in FIG. 3, part a, which is a section along a column 34. Part b thereof shows the structure in perspective.

Another disadvantage is that the rows and columns are only separated by an approximately 100-300 nm thick sandwich. It is clear that the edge of said sandwich is the preferred point for the formation of rows-columns short-circuits, either through the presence of conductive particles bridging said edge, or through the formation of conductive paths resulting e.g. from electrostatic breakdowns.

However, if such disadvantages exist, they are not very frequently encountered because, on screens with 80,000 dots (which represents the same number of row-column intersections), there are generally less than 5 short-circuits, even in the case of basic technology. However, this still constitutes an inherent disadvantage of the "two level" prior art process and must be eliminated if it is wished to obtain screens free from defects.

SUMMARY OF THE INVENTION

The object of the present invention is to obviate this disadvantage. For this purpose, it recommends during the second photogravure not to carry out the complete etching of the stack constituted by semiconductor 40, insulant 42 and metal 44, so as to avoid the appearance of an exposed edge, which leads to the aforementioned risks. According to the invention only the metal deposit for forming the rows is etched. This is made possible through the use of hydrogenated amorphous silicon carbide (aSiC:H) as the semiconductor, in place of the hitherto conventionally used amorphous silicon. The choice of hydrogenated amorphous silicon carbide is particularly appropriate as a result of its transparency. Thus, the presence of carbon (in a quantity limited to a few percent) is sufficient for increasing the forbidden band of the semiconductor and to force back the optical absorption towards the ultraviolent. Thus, this material can be virtually transparent, particularly when using a thin film (approximately 50 nm). From the strictly optical standpoint, the semiconductor can be left over the entire surface of the matrix, without the transparency of the screen being significantly detrimentally affected.

However, it is necessary to keep a watch on the leakage resistance introduced between a block and an adjacent column. It must remain very high, so that the time constant RC, in which the R is said resistance and C the capacitance of the liquid crystal cell greatly exceeds 20 ms, which is the average addressing time.

The following table gives the resistivity values for aSiH and aSiCH, as well as the photoconductivity of these two materials. The data makes it possible to conclude that, even under illumination, the leakage resistance R is adequate to have a negligible effect.

|    | aSiH      | aSiCH                    |
|----|-----------|--------------------------|
| E  | 1.6       | 2                        |
| R  | $10^9$    | $10^{10}$ to $10^{12}$   |
| PC | $10^{-5}$ | $10^{-5}$ to $10^{-11}$  |

In this table, E designates the forbidden band width in electron volt, R the resistivity in Ohm.cm and PC the photoconductivity in Ohm$^{-1}$.cm$^{-1}$ (the latter characteristic naturally being dependent on the carbon concentration).

The invention therefore specifically relates to an active matrix display screen as described hereinbefore with a first wall carrying a first level constituted by a matrix of blocks and a group of addressing columns and a second level comprising a group of addressing rows, said two levels being separated by a stack constituted by a semiconductor layer and an insulating layer, wherein in the stack separating the two levels, the semiconductor is of hydrogenated amorphous silicon carbide, said semiconductor layer and the insulating layer covering the entire first wall.

In a first variant, the first level comprising the addressing columns and the blocks is in contact with the first wall, the second level with the addressing rows being positioned above the hydrogenated silicon carbide - insulant stack.

In a second variant, the arrangement is reversed and the second level comprising the addressing rows is in contact with the first wall and it is the first level comprising the addressing columns and the blocks which is positioned above the insulant - hydrogenated silicon carbide stack.

In practice, the carbon concentration, in the hydrogenated amorphous silicon carbide, is between 2 and 10%. The thickness of the hydrogenated amorphous silicon carbide layer is between 20 and 100 nm.

The present invention also relates to a process for producing such a screen. This process comprises two variants corresponding to the two constructional variants for the screen, the one direct and the other reverse.

BRIEF DESCRIPTION OF THE DRAWINGS

The invention is described in greater detail hereinafter, relative to non-limitative embodiments and the attached drawings, wherein show:

FIG. 8 a second embodiment of the invention, in which the photogravure sequence is reversed and which leads to "reversed" transistors.

FIG. 9 a number of stages of a production process in said second variant.

DETAILED DESCRIPTION OF THE PREFERRED EMBODIMENTS

Figure 3:
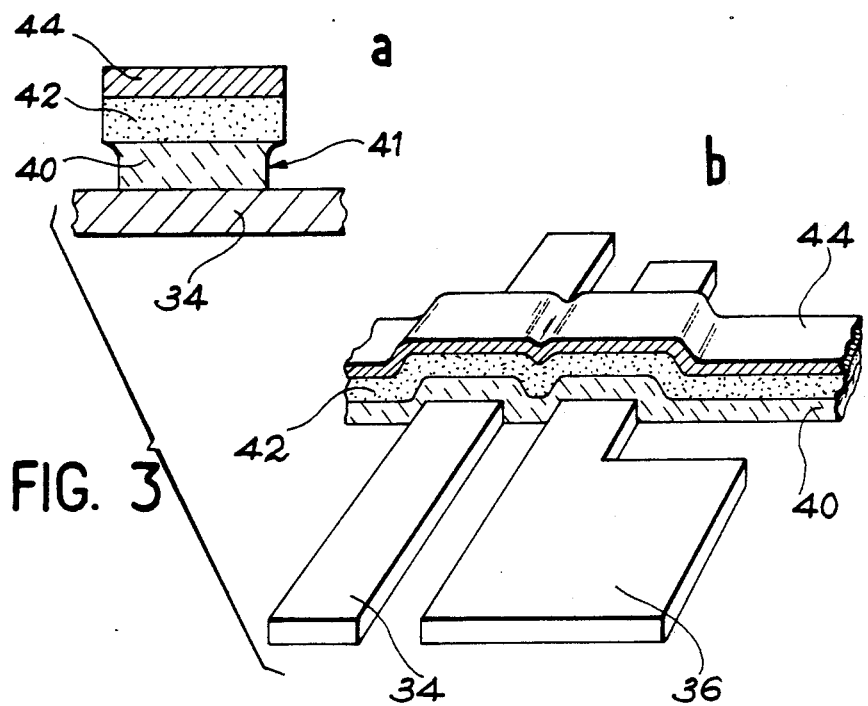
FIG. 3, already described, a detail of the prior art structure.
Figure 4:
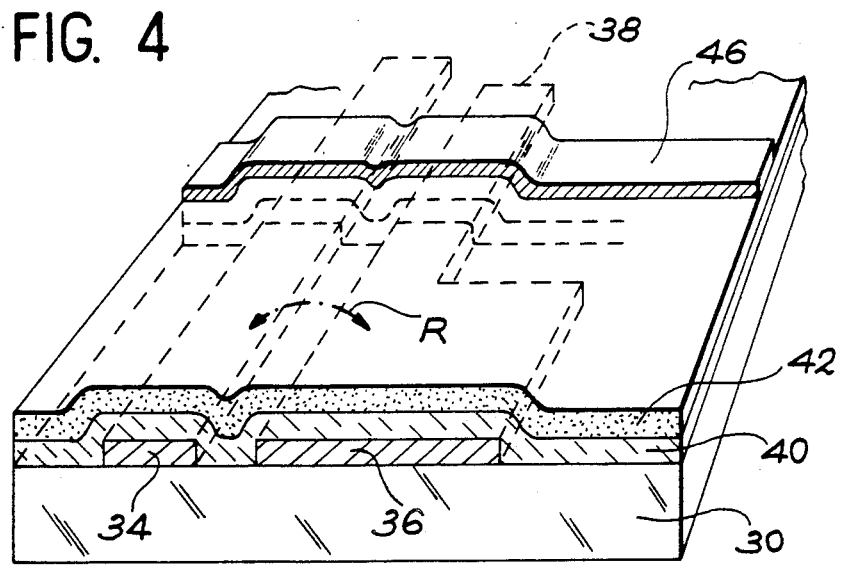
FIG. 4 in perspective a detail of a screen according to the invention.

FIG. 4 shows a detail of a display screen according to the invention in a perspective view similar to that of FIG. 3. It can be seen that, unlike in the prior art, the stack formed by semiconductor 40 an insulant 42 covers the entire wall 30 and in particular blocks 36 and columns 34. Thus, the columns and blocks are no longer exposed, so that there is no longer a risk of overetching of the semiconductor layer. This is made possible through the use of hydrogenated amorphous silicon carbide as semiconductor 40.

However, it will be seen that the presence of the hydrogenated amorphous silicon carbide layer over the entire surface of the wall leads to the appearance of a leakage resistance R symbolised by the double arrow R between a block and an adjacent column. It is this resistance which must be made high in order to have a time constant RC well above the addressing cycle which is approximately 20 ms.

Figure 5:
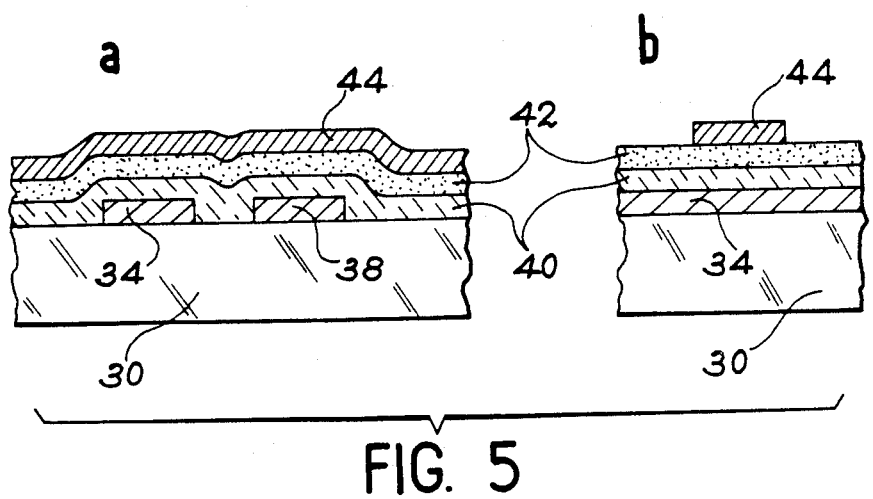
FIG. 5 (a,b) a section along a row (a) of a display screen according to the invention and a section along a column (b).

FIG. 5 shows two sections of the lower wall of a display screen according to the invention, section a being along an addressing row 44 and section b along a column 34. By comparison with part a of FIG. 3, it is possible to see the originality of the structure according to the invention with these insulating layers 42 made from hydrogenated amorphous silicon carbide 40 extending over the entire surface of the wall.

Figure 1:
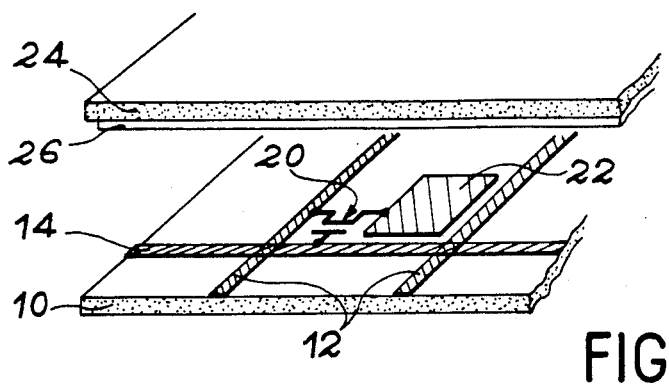
FIG. 1, already described, an active matrix display cell.
Figure 2:
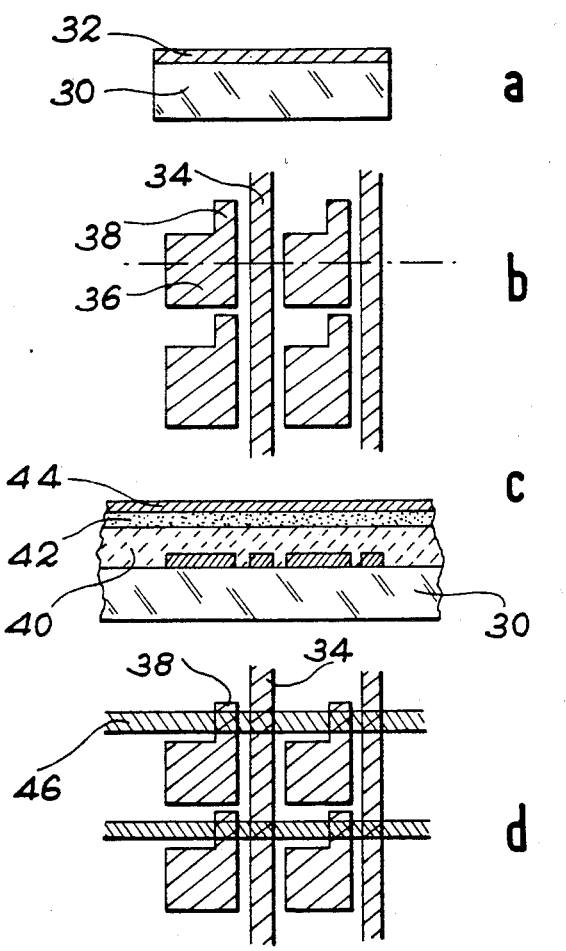
FIG. 2, already described, certain stages in a two level production process according to the prior art.

With regards to the process for producing such a screen, the operations are performed in the standard order, as described in the aforementioned French patent application 2 533 072. It is possible to refer to FIG. 2 of the present application, which gives the various stages of the process. Two operation levels are successively developed.

Level 1

Deposition of a tin and indium oxide transparent conductive layer.

Photogravure of the ITO layer and definition of the columns and blocks respectively forming the sources and drains of future transistors.

As a variant, it is possible to deposit, before etching, a doped amorphous silicon carbide layer on the ITO, in order to improve the contacts with the source and drain of the transistors.

Level 2

Deposition of aSiC:H by PECVD (Plasma Enhanced Chemical Vapor Deposition). The glass substrate is introduced into a reactor and raised to a temperature of close to 250° C. The operating or working gas (at reduced pressure) can be dilute silane with a small amount of methane or ethylene. A very low power radiofrequency plasma makes it possible to decompose these gases and form an aSiC:H deposit.

Deposition of insulant, e.g. $Si_3N_4$ by the same procedure, the working gas being on this occasion dilute silane and ammonia.

Deposition of the gate metal, e.g. aluminum. The aluminum is vacuum deposited by evaporation with an electron gun. As a variant, a "peeling" process can be used by firstly depositing a photoresist and then evaporating the aluminum. Finally the photoresist and excess metal are eliminated.

Etching of level 2. The aluminum deposit is etched with the aid of a second mask, so as to form addressing rows.

Figure 6:
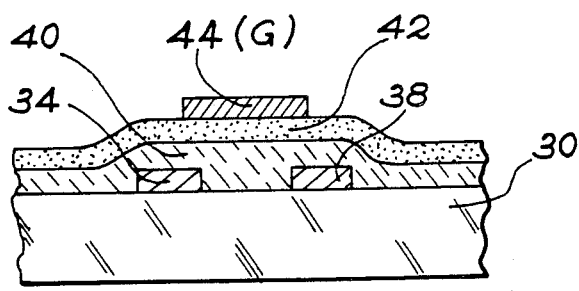
FIG. 6 diagrammatically a section through a thin film transistor.

FIG. 6 shows a section through the thin film transistor (TFT) obtained.

Figure 7:
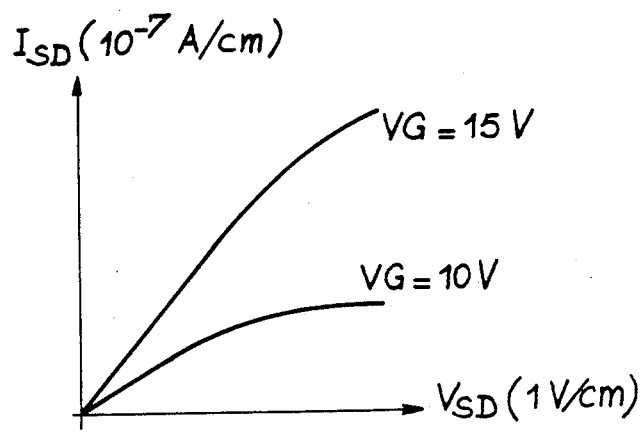
FIG. 7 voltage - current characteristics for said transistor.

Two drain-source current characteristics ($I_{SD}$) as a function of the drain-source voltage ($V_{SD}$) are given in FIG. 7 for two values of the gate voltage VG (10V and 15V).

FIG. 8 illustrates a "reverse" variant of the display screen according to the invention. In part a, which is a section perpendicular to the columns, it is possible to see that the gates 47 of the transistors are located on wall 30 and that the columns 34 are blocks 36 constituting the sources and drains are positioned above the stack constituted by the hydrogenated amorphous silicon carbide 44 and insulant 42. In part b, it is possible to see th screen from below and the segment 47 perpendicular to row 46, which makes it possible to constitute a gate for the TFT beneath the semiconductor-insulant stack.

In order to obtain this screen variant, the process must be slightly modified. The following operations can be performed in accordance with FIG. 9:

deposition on an insulating substrate 30 of a layer 44 of a conductive material, e.g. aluminum (a), photogravure of said layer in order to leave behind the rows with segments 47 perpendicular to the rows (b), deposition of an insulant layer 42 of a hydrogenated amorphous silicon carbide 44 and a transparent conductive material layer 32 (c), photogravure of layer 32 to form columns 34 and blocks 36 partly overlapping segments 47 perpendicular to the rows.

Thus, the invention provides three simplifications significantly reducing the costs of the display screen:

(1) simplification of equipment: the final etching necessary for freeing the aluminum rows is not critical and can be performed in much more basic machines than when it was a question of etching the complete stack constituting level 2;

(2) improvement of production efficiency: due to the disappearance of the exposed edges, the main cause of row-column short-circuits is eliminated;

(3) simplification of the process: the production time is significantly reduced.

What is claimed is:

1. An active matrix display screen comprising a first wall carrying a first level constituted by a matrix of blocks and a group of addressing columns and a second level comprising a group of addressing rows, said two levels being separated by a stack of a semiconductor layer and an insulating layer, said screen also comprising a second wall covered by a counterelectrode and a liquid crystal between these two walls, wherein in the stack separating the two levels, the semiconductor is of hydrogenated amorphous silicon carbide, the semiconductor layer and the insulating layer then covering the entire first wall.

2. A display screen according to claim 1, wherein the hydrogenated amorphous silicon carbide comprises carbon present at a concentration of a few percent.

3. A display screen according to claim 1, wherein the thickness of the hydrogenated amorphous silicon carbide layer is approximately 50 nm.

4. A display screen according to claim 1, wherein the first level comprising the addressing columns and blocks is in contact with the first wall and wherein the second level with the addressing rows is positioned above the stack constituted by the hydrogenated silicon carbide and the insulant.

5. A display screen according to claim 1, wherein the second level comprising the addressing rows is in contact with the first wall and wherein the first level comprising the addressing columns and the blocks is positioned above the stack constituted by the insulant and the hydrogenated silicon carbide.

6. A process for the production of a display screen according to claim 1, consisting of depositing on a first wall by only two photogravure operations, a first level comprising a group of addressing columns, a matrix of blocks and a second level comprising a group of addressing rows, and forming a stack of a semiconductor layer and an insulating layer separating the two levels, wherein the semiconductor is of hydrogenated amorphous silicon carbide and the semiconductor layer and the insulating layer are located over the entire wall.

7. A process according to claim 6, wherein it comprises depositing a layer of a first transparent conductive material on an insulating substrate, a first photogravure applied to said first layer to constitute a matrix of blocks, each block being connected to a block segment, said first photogravure leaving behind columns of said first conductive material, deposition of a hydrogenated amorphous silicon carbide layer, deposition of an insulating layer, deposition of a layer of a second conductive material, second photogravure applied solely to said second conductive material, said second photogravure leaving behind rows of the second condutive material, these rows passing above the block segments, the overlap zones of a row with a column and with a block segment defining the source and drain of a thin film transistor, the gate of said transistor being constituted by that part of the row located between the block segment and the column.

8. A process according to claim 6, wherein it comprises depositing on an insulating substrate a layer of a conductive material, photogravure of said layer to leave behind rows with segments perpendicular to the rows, deposition of an insulating layer, deposition of a hydrogenated amorphous silicon carbide layer, deposition of a layer of transparent conductive material and photogravure of the last layer to form columns and blocks partly overlapping the segments perpendicular to the rows.

* * * * *